US006051917A

United States Patent [19]

Nakasuji

[11] Patent Number: 6,051,917

[45] Date of Patent: Apr. 18, 2000

[54] ELECTRON BEAM GUN

[75] Inventor: Mamoru Nakasuji, Yokohama, Japan

[73] Assignee: Nikon Corporation, Tokyo, Japan

[21] Appl. No.: 08/910,129

[22] Filed: Aug. 12, 1997

[30] Foreign Application Priority Data

| | | | |
|---|---|---|---|
| Aug. 12, 1996 | [JP] | Japan | 8-212280 |
| Oct. 7, 1996 | [JP] | Japan | 8-265812 |

[51] Int. Cl.[7] .............................. H01L 21/027; H01J 3/02

[52] U.S. Cl. .......................... 313/308; 313/446; 313/452; 313/326

[58] Field of Search .................................... 313/308, 441, 313/446, 452, 458, 460, 326; 315/5.34, 5.38

[56] References Cited

U.S. PATENT DOCUMENTS 3,903,450 9/1975 Forbess et al. ..................... 313/452 X

FOREIGN PATENT DOCUMENTS 04027325 1/1992 Japan .

OTHER PUBLICATIONS

Abstract of the Proceedings of the 40th International Conference on Electron, Ion and Proton Beam Technology, held May 28–31, 1996, Atlanta, Georgia.

Cutler et al., "Thermal Velocity Effects in Electron Guns," Proceedings of the IRE, pp. 307–314, Mar. 1955.

*Primary Examiner*—Ashok Patel

*Attorney, Agent, or Firm*—Klarquist Sparkman Campbell Leigh & Whinston, LLP

[57] ABSTRACT

Electron guns are disclosed that produce low-brightness and high-emittance electron beams that are suitable for use in an electron-beam reduction-lithography apparatus. A preferred embodiment comprises a cathode, a Wehnelt electrode, an anode, and at least one control electrode placed between the cathode and the anode. Each of these components defines a spherical surface all having a common center point and all thus being concentric with one another. During operation, the anode has a grounded electrical potential while the cathode and the Wehnelt electrode each have a potential of about −100 KV. If the applied voltage to the control electrode is adjusted within a range of −99 to −90 KV, the brightness can be controlled to within a range of $1\times10^3$ to $2\times10^4$ A/cm$^2$.sr.

25 Claims, 7 Drawing Sheets

FIG. 2(a)
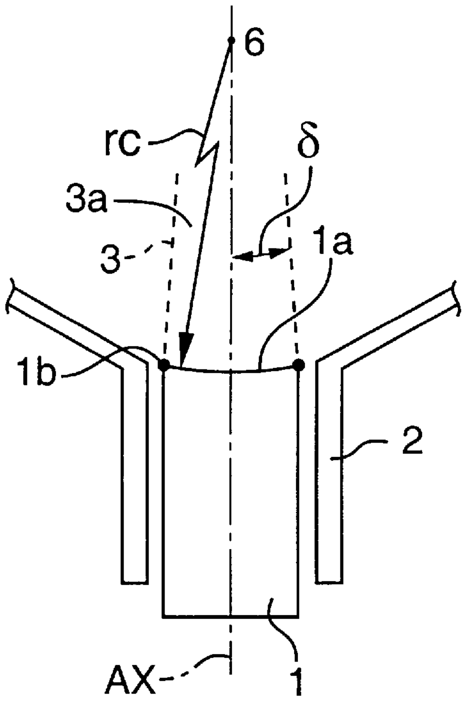
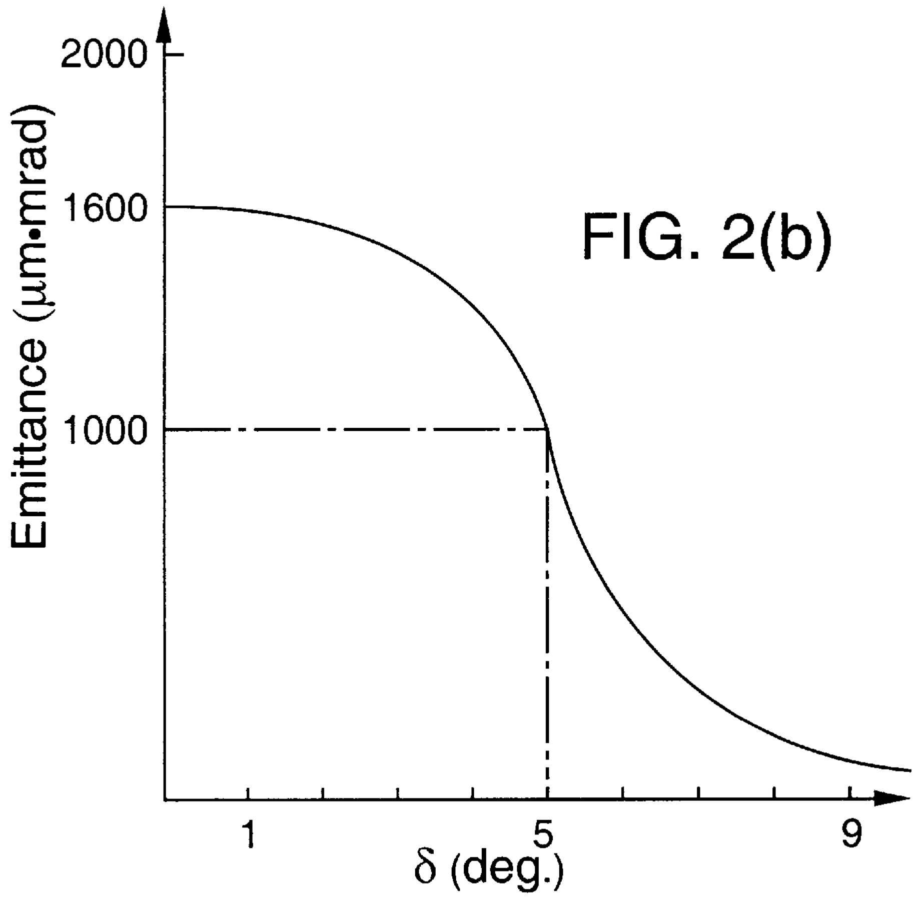
FIG. 2(b)

ELECTRON BEAM GUN

FIELD OF THE INVENTION

This invention pertains to electron guns used in electron-beam reduction lithography apparatus.

BACKGROUND OF THE INVENTION

Heretofore, in traveling-wave tubes and klystron microwave electron tubes, Pierce type electron guns have been used. Also, use of such Pierce type electron guns has been proposed in electron-beam reduction-projection (microlithography) devices (Japanese laid-open patent document no. 5-190430).

Since the Pierce type electron gun was built for use in a microwave electron tube as described above, gun performance is frequently expressed in terms of beam diameter, current density, or perveance, rather than emittance or brightness.

SUMMARY OF THE INVENTION

In view of the foregoing, an object of the invention is to provide an electron gun that is suitable for use in an electron-beam reduction-lithography apparatus in which low brightness and high emittance are required.

The foregoing object is met by electron guns according to the present invention which comprise, on an optical axis, a cathode comprising an electron-emission surface, a Wehnelt electrode, an anode, and a control electrode situated between the cathode and the anode. The control electrode serves to change the electric field at the electron-emission surface of the cathode.

The control electrode preferably comprises a spherical portion that is symmetrical about the optical axis and that has a curvature radius extending from a center point located on the optical axis. Also, the anode preferably has a spherical portion that is symmetrical about the optical axis and that has a curvature radius extending from the center point. Additionally, the electron-emission surface of the cathode preferably comprises a spherically concave portion that has a curvature radius extending from the center point. The curvature radius of the control electrode is preferably midway between the curvature radius of the electron-emission surface and the curvature radius of the anode. These features form equipotential surfaces along a beam envelope traversed by the electron beam during operation of the electron gun. Such equipotential surfaces are concentric spherical surfaces each having a center at the center point.

Further according to a preferred embodiment, an angle between the Wehnelt electrode and an edge of a beam envelope of an electron beam emitted from the cathode is 70–85°.

If desired, the electron-emission surface of the cathode can be planar rather than spherically concave, to reduce cathode production costs and allow a relaxation of manufacturing tolerances.

Especially with electron guns having a spherically concave electron-emission surface as summarized above, the electron-emission surface of the cathode defines an edge that is symmetrical about the optical axis. Such an edge is preferably at a half angle, between the optical axis and a line extending from the edge to the center point, of 5° or less. With such a configuration, the control electrode preferably comprises a spherical portion symmetrical about the optical axis and having a center at the center point. The spherical portion of such a control electrode defines a half angle $\phi_2$ relative to the center point and situated between the optical axis and a portion of the spherical portion located farthest away from the optical axis. Also, the anode preferably has a spherical portion symmetrical about the optical axis and having a center of curvature located at the center point. The spherical portion of the anode defines a half angle $\phi_1$ relative to the center point and situated between the optical axis and a portion of the spherical portion located farthest from the optical axis. In such a configuration, the larger of $\phi_1$ and $\phi_2$ is at least 80°. This results in greater emittance.

During operation, the anode is normally electrically grounded, and the Wehnelt electrode normally has an electric potential that is the same as the electric potential of the cathode. Changing the electric potential of the control electrode controls the brightness of the electron beam produced by the electron gun.

When the electron-emission surface is spherically concave as summarized above with a curvature radius extending from the center point, and the anode comprises a spherical portion rotationally about the optical axis and having a center of curvature on the center point, the ratio of the curvature radius of the electron-emission surface and the curvature radius of the anode is at least 5 mm. This allows for a suitably small brightness.

The electron gun is preferably enclosed in a housing. During operation, the housing is preferably electrically grounded. The electron gun also preferably comprises an electrode that shields the electron beam, emitted from the electron-emission surface and propagating inside a beam envelope, from the electrically grounded potential of the housing. This facilitates prevention of distortion of the spherical shape of the equipotential surfaces along the beam envelope.

According to another aspect of the invention, an electron gun is provided that comprises, along an optical axis, a cathode comprising an electron-emission surface, a Wehnelt electrode, an anode, and multiple control electrodes situated between the Wehnelt electrode and the anode. During operation of such an electron gun, an electric field produced between the cathode and the anode is controlled by the control electrodes. Each of the control electrodes preferably comprises a spherical portion symmetrical about the optical axis and situated adjacent the optical axis. Each spherical portion defines an aperture concentric with the optical axis. Also, each spherical portion has a respective curvature radius extending from a single center point situated on the optical axis. The control electrodes serve to control the electrical field between the cathode and the anode.

In the foregoing embodiment, the anode preferably comprises a spherical portion symmetrical about the optical axis and situated adjacent the optical axis. The spherical portion of the anode also has a curvature radius extending from the center point.

The multiple control electrodes are preferably interconnected by electrical resistors so as to allow a single power supply to be used to apply electrical power to the control electrodes and the anode.

In the foregoing embodiment, the spherical portions of adjacent control electrodes are separated from each other by a respective radial distance. Also, the anode and the adjacent control electrode are separated from each other by a respective radial distance. Each of the respective radial distances between the anode and the adjacent control electrode and between adjacent control electrodes is shorter than a length of an arc, concentric with the spherical surfaces, between the optical axis and a location on the respective anode and control electrodes where the respective spherical portion ends farthest away from the optical axis.

In the embodiment summarized above, an equipotential surface is formed, during operation of the electron gun, in a region adjoining the cathode. The equipotential surface is shaped to cancel out any space-charge effects that would otherwise act on an electron beam propagating from the electron-emission surface. This makes it possible to reduce aberrations.

The following detailed description and drawings, are intended to exemplify the various possible configurations of an electron gun according to the invention and are not intended to be limiting with respect to various possible embodiments of this invention.

The foregoing and other features and advantages of the invention will be more readily apparent from the following detailed description, which proceeds with reference to the accompanying drawings.

BRIEF DESCRIPTION OF THE DRAWINGS

FIGS. 2(*a*)–2(*b*) are diagrams explaining the relationship between the cathode and the emittance. FIG. 2(*a*) is an enlargement of the cathode section, and FIG. 2(*b*) is a plot of the relationship between the half-angle $\delta$ and the emittance.

FIG. 4(*a*) is a sectional view of the control electrode, and FIG. 4(*b*) is a sectional view of the anode.

DETAILED DESCRIPTION OF PREFERRED EMBODIMENTS

This invention is described with reference to several preferred embodiments.

First Embodiment

The first embodiment is described with reference to FIGS. 1–6.

In electron-beam reduction lithography, for example, a rectangular (1000 μm per side) pattern (defined on a mask) having a comparatively broad field size is transferred entirely at the same instant to a sensitive substrate. For transfer, the electron beam is shaped in accordance with the mask pattern. The electron beam is focused on the substrate after passing through a "crossover" (i.e., an axial region where the electron beam exhibits minimal dispersion). In the vicinity of the crossover, individual electrons repel each other. Such repulsion can change electron trajectories by a so-called "space-charge effect". As a result, the image formed on the substrate exhibits blur. To reduce blur, the half-angle $\alpha$ (at the crossover as viewed from the substrate), must be enlarged while reducing the electron-beam current.

To obtain such a beam with an electron gun, the brightness is preferably small and the emittance (which is the product of the half angle $\alpha$ and the dimensions of the field of view) should be relatively large. More specifically, the brightness is preferably about $1\times10^3$ (A/cm$^2$.sr) and the emittance is preferably about 2000 (μm.mrad).

To reduce brightness, the electric field at the cathode surface should be small.

To obtain a high-emittance beam, the electron beam propagating from the cathode surface must be nearly uniform. Also, equipotential surfaces comprising each of the electrodes making up the electron gun must be essentially concentric spheres.

The configuration of the first embodiment is based on the foregoing design criteria, as optimized using computer simulation.

Figure 1:
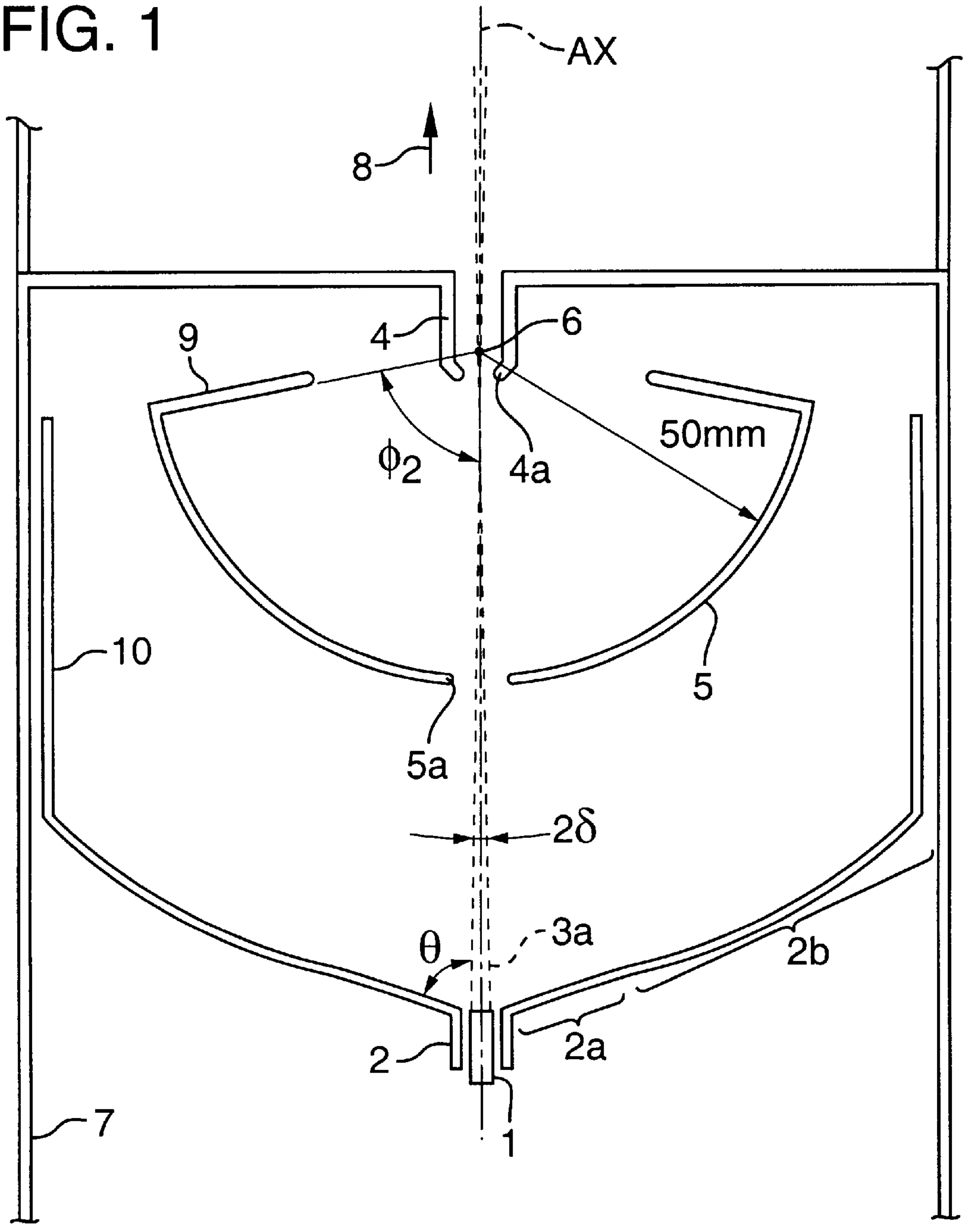
FIG. 1 is a sectional view of an electron gun according to a preferred embodiment of the invention.

The overall configuration of the first embodiment is shown in FIG. 1 as a sectional view. In FIG. 1, the cathode 1 emitts a charged particle beam (termed herein an "electron beam", but will be understood to encompass any of various other charged particle beams such as an ion beam). A Wehnelt electrode 2 is disposed relative to the cathode 1 as shown. Both the cathode 1 and the Wehnelt electrode 2 preferably have an applied potential of about −100 KV. A portion 2*a* of the Wehnelt electrode proximal to the cathode 1 is conical. A distal portion 2*b* preferably has a spherical profile with an axial point 6 being the center of the sphere. (During operation, a crossover for the electron beam is located at the point 6.) A conical electrode portion 10 is situated on an outer edge of the distal portion 2*b* and also has a potential of, preferably, about −100 KV during operation.

An anode 4 has a grounded electrical potential during operation. The anode 4 comprises a section 4*a* that faces the cathode 1 and has a spherical profile; the center of the sphere is the point 6 on the optical axis Ax.

A control electrode 5 is situated between the cathode 1 and the anode 4. The control electrode 5 has, as its center, the axial point 6. The control electrode 5 has a preferred thickness of 1 mm and a preferred external curvature radius of 50 mm.

The electron gun of FIG. 1 also comprises an electrode 9 forming a portion of a conic surface of which the axial point 6 represents the location of the vertex of the conical surface. The electrode 9 is contiguous with the control electrode 5. An angle $\phi_2$ between the electrode 9 and the optical axis Ax is preferably 85°. Also, an edge 5*a* of the control electrode 5 adjacent the optical axis Ax has a radius of, preferably, 0.5 mm. The edge 5*a* thus defines an aperture through which the optical axis Ax passes. The radiused edge 5*a* is useful for preventing electrical discharge from the control electrode.

The electron gun of the FIG. 1 embodiment is enclosed in a housing 7 that is preferably electrically grounded during operation. The electrodes 9, 10 are arranged so that the grounded electrical potential of the housing 7 does not disturb concentric, equipotential surfaces formed in the "beam envelope" 3*a*, described below. Also, an optical system of an electron-beam reduction-projection device is situated downstream (arrow 8) relative to the electron gun of FIG. 1.

FIG. 2(*a*) shows an enlargement of the region around the cathode 1 of the FIG. 1 embodiment. The cathode 1 is preferably cylindrical relative to the optical axis Ax and comprises an electron-emission surface 1*a*. The electron-emission surface 1*a* is preferably spherical, with the axial point 6 being the center of the sphere. The curvature radius $r_c$ of the electron-emission surface 1*a* is preferably 100 mm.

The electron-emission surface 1*a* can alternatively be a planar surface so as to, for example, reduce manufacturing costs.

The electron beam emitted from the electron-emission surface 1*a* has a boundary 3 as the beam propagates along the optical axis Ax. Thus, the "beam envelope" is the axial region 3*a* within the confines of the boundary 3 in the direction of the optical axis as the beam propagates away from the electron-emission surface 1*a*.

The relationship between the half angle δ (FIG. 2(*a*) at the edge 1*b* of the electron-emission surface and extending to the axial point 6) and emittance is shown in FIG. 2(*b*). As can be seen in FIG. 2(*b*), a location at which the most rapid change in emittance occurs is at approximately δ=5°. Therefore, it is desirable that the half angle δ be 5° or less.

In conventional Pierce-type electron guns, the Wehnelt electrode normally has a conical shape as does the proximal portion 2*a* of the Wehnelt electrode in the FIG. 1 embodiment. Conventionally, an angle of 67.5° (corresponding to θ in FIG. 1) between the boundary 3 of the beam envelope and the surface of the Wehnelt electrode proximal to the beam envelope is regarded as satisfactory. However, in this embodiment, the angle θ between the proximal portion 2*a* of the Wehnelt electrode and the boundary 3 of the beam envelope 3*a* is preferably 70–85°. The proximal portion 2*a* of the Wehnelt electrode forms conically shaped equipotential surfaces and serves to focus the electron beam emitted from the cathode 1.

When using the electron gun of FIG. 1 for electron-beam reduction lithography, an electron-beam reduction-projection device can be employed axially downstream of the electron gun. This allows the current density as used in electron-beam reduction lithography to be considerably smaller than current densities found in, e.g. electron tubes and other apparatus. Also, with such an arrangement, the beam energy is high but space-charge effects are smaller than in electron tubes. Thus, in order to reduce forces normally used to restrain space-charge effect, the angle θ is preferably higher than conventionally.

Figure 3:
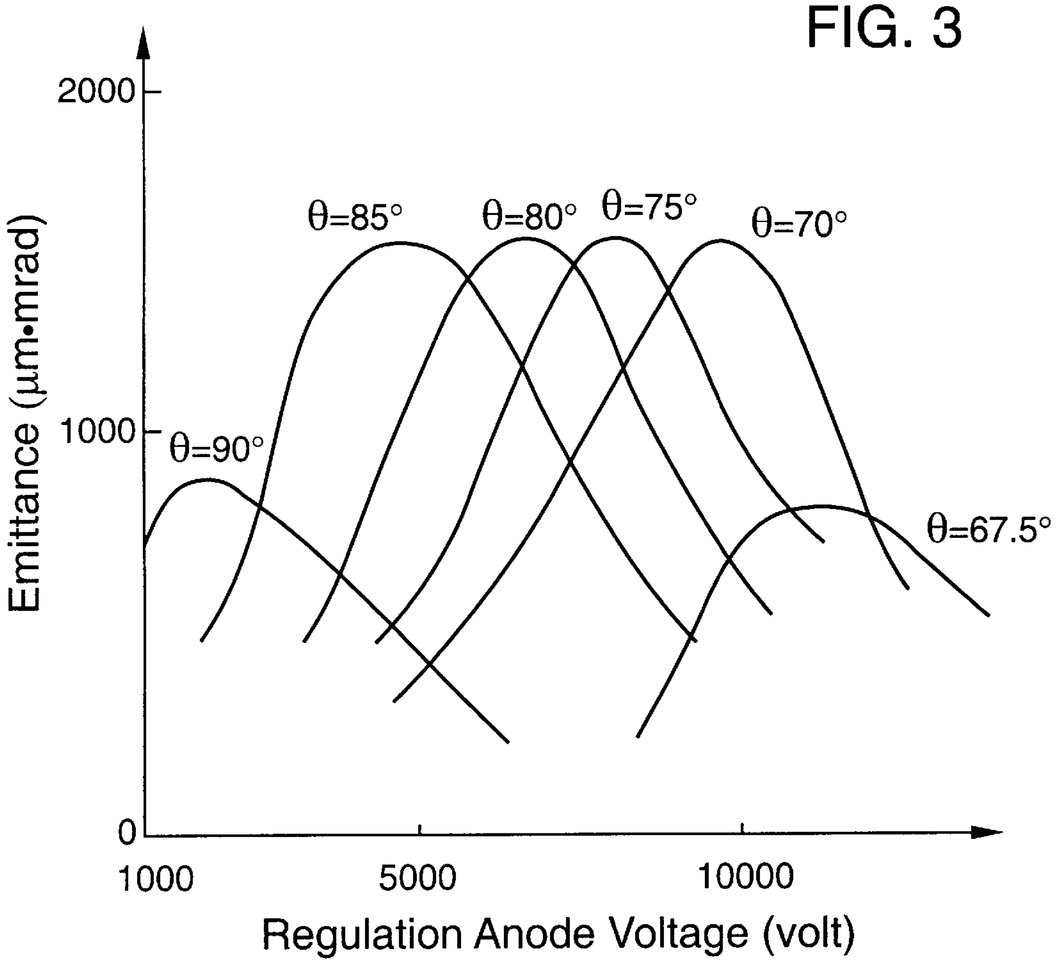
FIG. 3 is a plot of the relationship between the angle $\theta$ and the emittance.

FIG. 3 depicts plots showing the relationship between the angle θ (calculated using computer simulations) and emittance. To generate the plots, the angle θ was set at any of six possible angles from 67.5° to 90° as noted in the figure. The plots show the resulting emittance when the control electrode voltage relative to each θ. For θ=70–85°, the peak of each curve is at approximately 1500 μm.mrad. Outside this range of angles, the peak changes suddenly to 1000 μm.mrad or less. That is, where θ=70–85°, the emittance can be set to approximately 1500 μm.mrad or more by adjusting the control voltage in the range of 1–10 KV as shown in the diagram.

For the results shown in FIG. 3, the adjustment range of the control-anode voltage was 1–10 KV based on simulations performed with the cathode 1 set at 0 V. During actual use, with the anode 4 at 0 V and the cathode 1 at −100 KV, the control voltages were in the range of −99 to −90 KV.

Figure 4A:
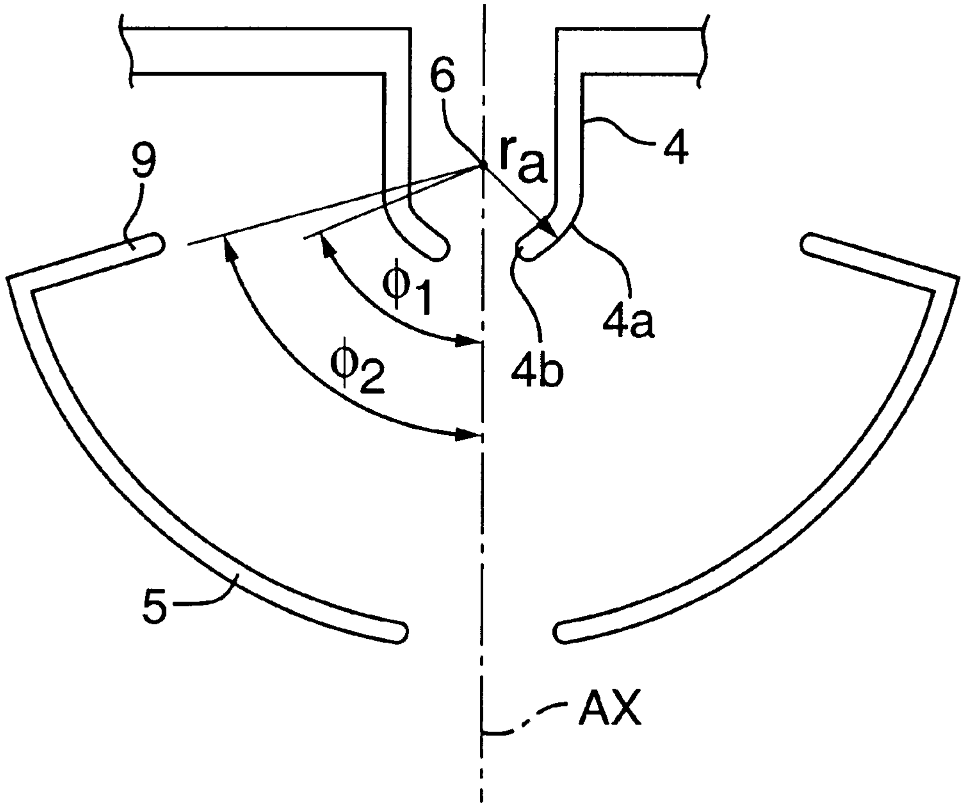
FIGS. 4(*a*)–4(*b*) show certain features of the control electrode and the anode in the FIG. 1 embodiment.
Figure 4B:
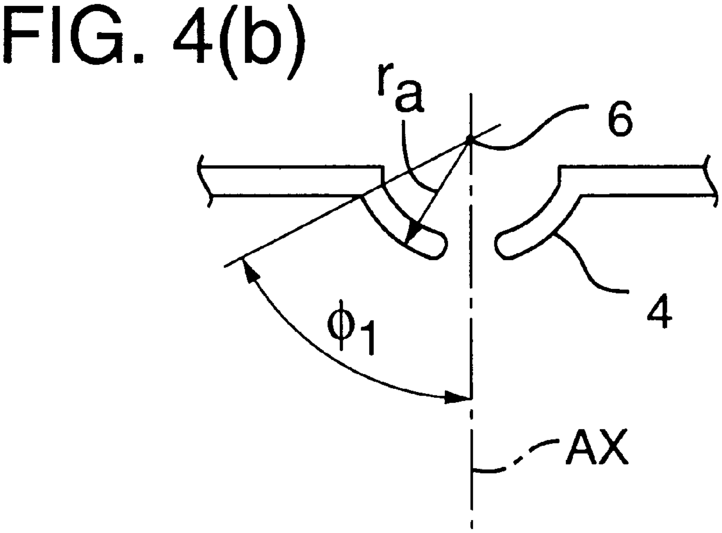

FIG. 4(*a*) shows the preferred relationship between the anode 4 and the control electrode 5. With respect to the spherical section 4*a* facing the cathode, the curvature radius $r_a$ is preferably 9 mm and the thickness is preferably 1 mm. Also, an edge 4*b* of the section 4*a* is preferably provided with a 0.5-mm radius.

Figure 5:
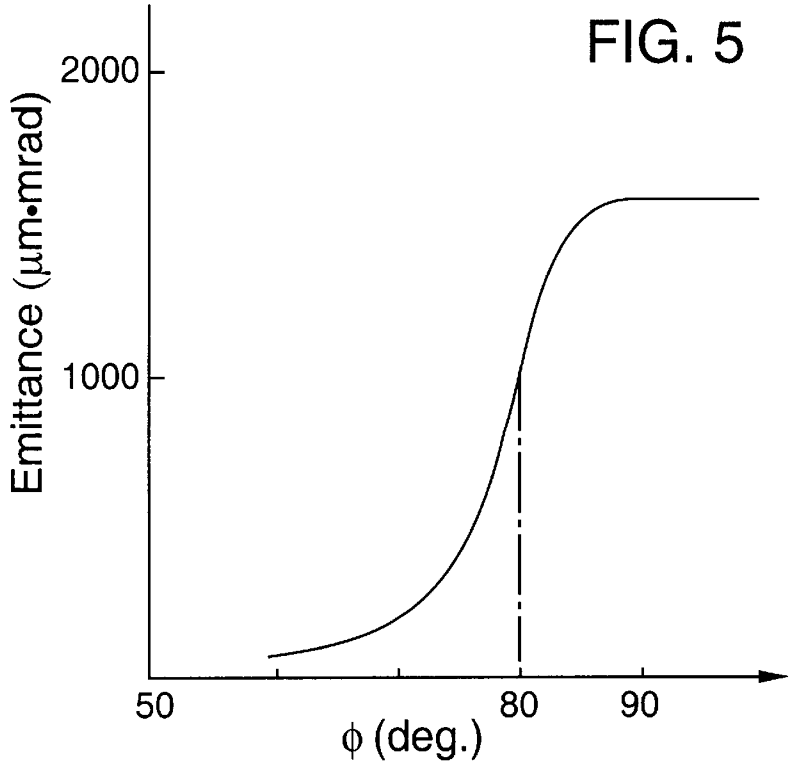
FIG. 5 is a plot showing the relationship between the angle $\phi$ and the emittance.

Further with respect to FIG. 4(*a*), the angles $\phi_1$ and $\phi_2$ are both preferably 85°. The relationship between these angles φ and emittance is shown in FIG. 5. As can be seen, at φ values of approximately 80°, emittance changes greatly with an incremental change in emittance. Thus, it is preferable that the angles φ be 80° or higher.

The ranges of the angles $\phi_1$ and $\phi_2$ are set as follows: As shown in FIG. 4(*a*), when the spherical section 4*a* is situated at the terminus of a cylindrical portion of the anode 4, $\phi_1 \leqq \phi_2$. In contrast, as shown in FIG. 4(*b*), when the spherical section 4*a* is not situated on a terminus of a cylindrical portion, $\phi_1 > \phi_2$. In any event, the larger of $\phi_1$ and $\phi_2$ is preferably 80° or more.

Figure 6:
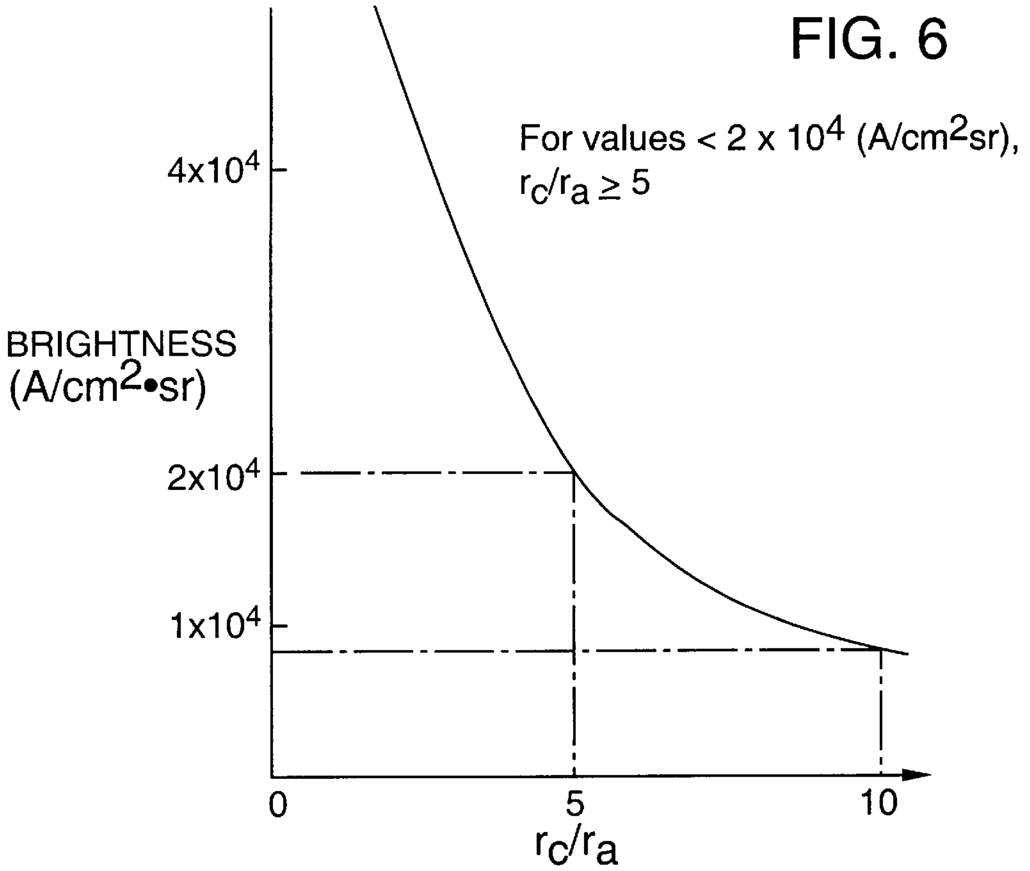
FIG. 6 is a plot showing the relationship between the ratio of curvature radii $r_c/r_a$ and the brightness.

FIG. 6 illustrates the relationship between brightness and $r_c/r_a$, wherein $r_c/r_a$ is a ratio of the curvature radius of the anode 4 ($r_a$) and the curvature radius of the cathode 1 ($r_c$). When $r_c/r_a \geqq 10$, the brightness is preferably no greater than $1\times10^3$ A/cm$^2$.sr. When $r_c/r_a \geqq 5$, the brightness is preferably no greater than $2\times10_4$ A/cm$^2$.sr.

When −100 KV of voltage is applied to the cathode 1 and the Wehnelt electrode 2, by varying the voltage of the control electrode 5 in the range of −99 to −90 KV, it is possible to adjust the brightness within a range of $1\times10^3$ to $1\times10^4$ A/cm$^2$.sr. In such instances, the emittance is 4000 to 3100 μm.mrad.

Because the ratio $r_c/r_a$ is preferably 10 or more in this embodiment, the electric field at the electron-emission surface 1*a* is less intense and the hence the brightness can be made smaller.

The electron-emission surface 1*a*, the distal portion 2*b* of the Wehnelt electrode 2, the control electrode 5, and the anode 4 are preferably, as discussed above, concentrically spherical in profile with centers all located at the axial point 6. The electrodes 9 and 10 reduce the influence of the grounded electrical potential of the housing 7; also, the equipotential surfaces of the beam envelope 3*a* define concentric spherical surfaces with the point 6 at the crossover position. These features allow high emittance to be achieved.

Whereas the curvature radius $r_c$ of the electron-emission surface 1*a* is 100 mm, the curvature radius $r_a$ of the anode 4 is 9 mm, and the curvature radius of the control electrode 5 is about 50 mm (representing a median between $r_c$ and $r_a$). As a result, the cathode 1 is electrically insulated from the control electrode 5, and the control electrode 5 is electrically insulated from the anode 4. This eliminates the need to use insulating material that could have an effect in regions near the optical axis Ax.

Second Embodiment

Figure 7:
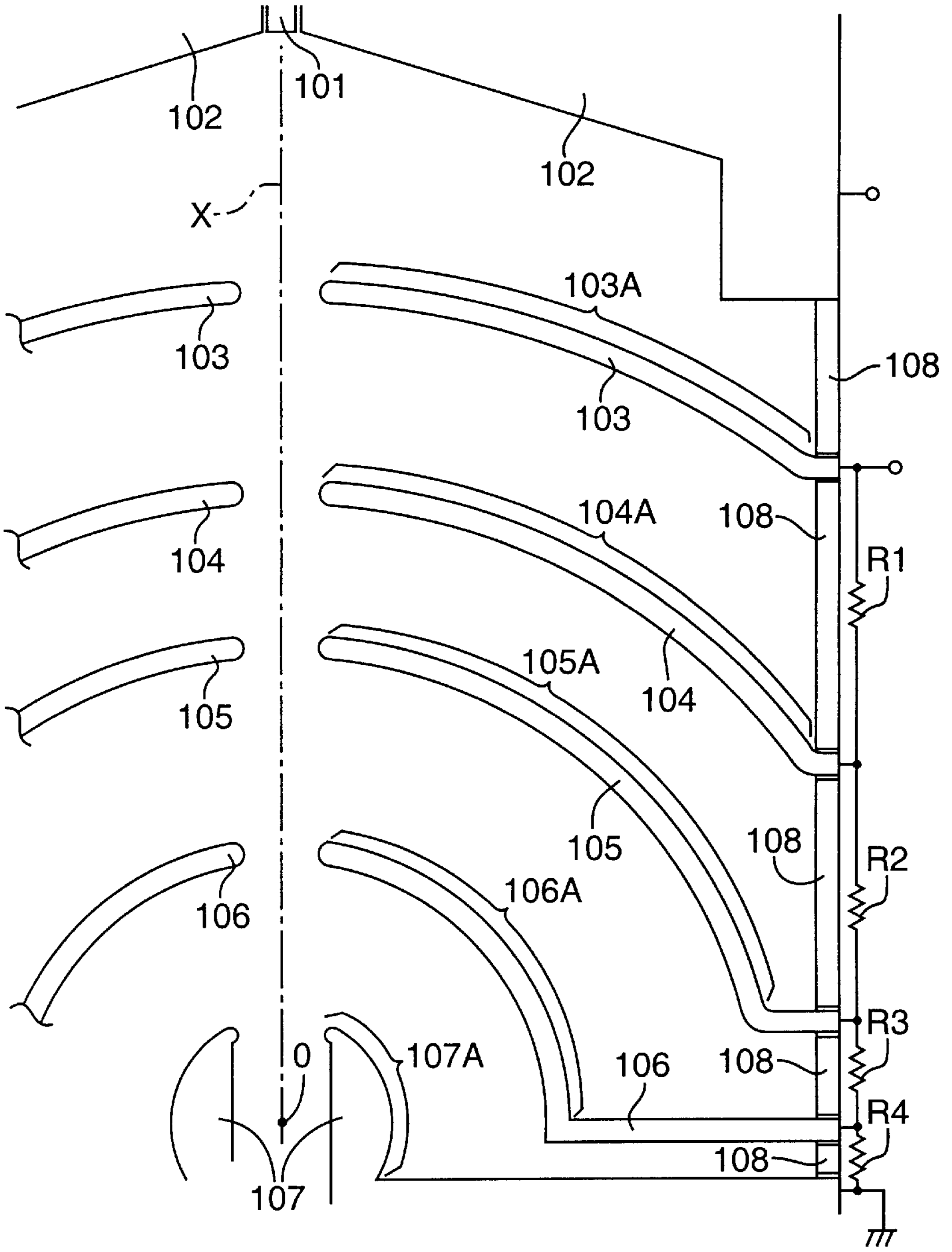
FIG. 7 is sectional view of an electron gun according to a second embodiment of the invention.

The second embodiment is described below with reference to FIGS. 7–8. FIG. 7 is a representative section showing surfaces through which the optical axis X of the subject electron gun (of this embodiment) passes. A cathode 101 is provided with a concave shaped electron-emission surface having a curvature radius of, preferably, 100 mm. The electron gun also comprises a Wehnelt electrode 102, a first control electrode 103, a second control electrode 104, a third control electrode 105, a fourth control electrode 106, and an anode 107. An insulator 108 supports the Wehnelt electrode 102, the first through fourth control electrodes 103–106, and the anode 107. The cathode 101, the Wehnelt electrode 102, the first through fourth control electrodes 103–106, and the anode 107 are formed with a spherical symmetry relative to the optical axis X. Each of the Wehnelt electrode 102, the first through fourth control electrodes 103–106, and the anode define a respective aperture through which the optical axis X extends. An electron beam passes through the apertures.

The first control electrode 103 comprises a spherical portion 103A; the second control electrode 104 comprises a spherical portion 104A; the third control electrode 105 comprises a spherical portion 105A; and the fourth control electrode 106 comprises a spherical portion 106A. Each of the spherical portions 103A, 104A, 105A, 106A constitutes a portion of a concentric sphere having a center at an axial point O. Also, the anode comprises a spherical portion 107A having a center of curvature located at the axial point O.

The distance from the electron-emission surface of the cathode 101 to the axial point O is preferably 100 mm. The electron discharge surface is preferably spherically concave with the axial point O being the center of curvature.

A power supply (not shown) is connected to the first, second, third, and fourth control electrodes 103, 104, 105, 106, respectively, and to the anode 107 by means of split resistors R1, R2, R3, and R4 (FIG. 7). Thus, a single power supply can be used to provide each of these electrodes with the proper voltage. The cathode 101 and the Wehnelt electrode 102 are connected to a separate power supply (not shown).

During use, the anode 107 preferably has a ground electrical potential, and the cathode 101 preferably has an applied voltage of about −100 KV. The Wehnelt electrode 102 typically has an applied voltage of approximately 10–100 V relative to the cathode 101, the first control electrode 103 has an applied voltage of about −95 KV, the second control electrode 104 has an applied voltage of about −80 KV, the third control electrode 105 has an applied voltage of about −60 KV, and the fourth control electrode 106 has an applied voltage of about −30 KV.

Disregarding any space-charge effects, electrons emitted from the cathode would be desirably focused on the axial point O without aberrations in the electrical fields formed by the charged, hollow spheres. However, forces arising from space-charge effects act on the propagating electrons. Also, because the anode and the control electrodes must be physically supported, it is very difficult to form spherical electrodes that are perfectly concentric relative to each other. Nevertheless, concentricity is important at least in the proximity of the optical axis. With an electron gun configured according to this embodiment, the potential created by any electrode whose position has shifted from ideal concentricity would have no effect on the optical axis X. The configuration of this embodiment also partially eliminates space-charge effects. Consequently, electrons emitted from the cathode 101 are focused on the axial point O with almost no aberration, as explained in more detail below.

In an area between the Wehnelt electrode 102 and the first control electrode 103, electrons emitted from the cathode 101 are repelled away from the optical axis X by space-charge effects. However, with the electron gun according to this embodiment, the electrons are pushed back toward the optical axis X. Thus, forces arising from space-charge effects are effectively cancelled. In the region of the optical axis X, the curvature radii of the equipotential surfaces are smaller than the respective spherical surfaces having centers at the axial point O.

The electron beam passing through the first control electrode 103 has already been accelerated to high energy, so space-charge effects have little effect. With concentric spherical equipotential surfaces in this embodiment, aberrations can be made sufficiently small to produce, downstream of the first control electrode 103, concentric, spherical equipotential surfaces in the axial space through which the electron beam passes.

Further with respect to this embodiment, in the space between the first control electrode 103 and the anode 107, concentric spherical equipotential surfaces are formed along the optical axis X. As shown in FIG. 8, the surface shape of the anode 107 makes the gap L1 between the spherical anode portion 107A and the spherical portion 106A of the control electrode 106 shorter than the length L2 (the circumferential distance to the optical axis X from a position where the surface shape of the anode 107 changes from spherical).

Figure 8:
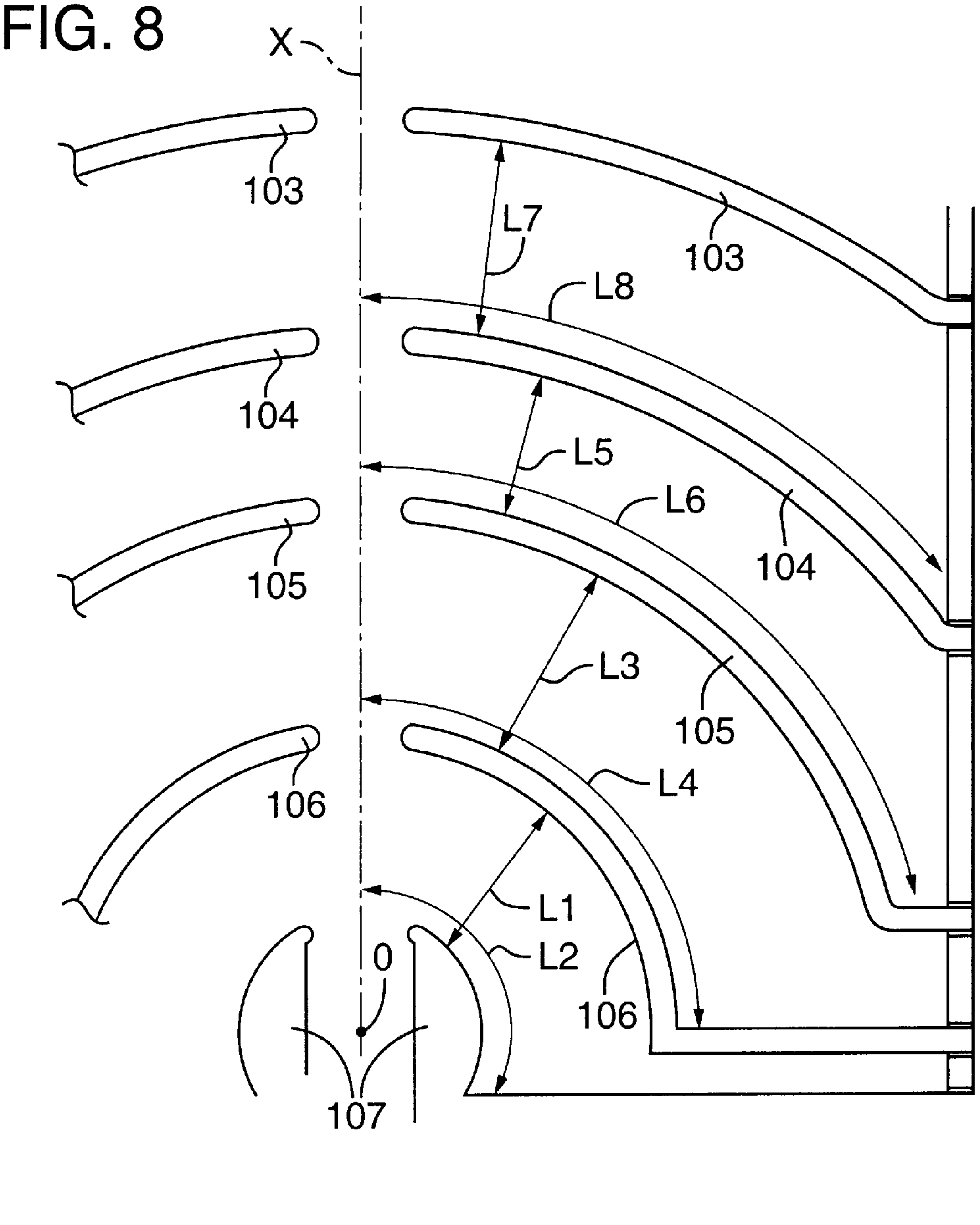
FIG. 8 shows relative distances between electrodes and distances from a point at which each electrode diverges from a point of concentricity.

In FIG. 8, the respective distances from the optical axis X to respective positions where the surface shapes of the first through fourth control electrodes 103–106 change from spherical are denoted L8, L6, L4. Also, the distance between the fourth control electrode 107 and the third control electrode 105 is denoted L3; the distance between the third control electrode 105 and the second control electrode 104 is denoted L5; and the distance between the second control electrode 104 and the first control electrode 103 is denoted L7. The electron gun of this embodiment satisfies the following:

$$L3<L4$$

$$L5<L6$$

$$L7<L8$$

As shown in FIG. 8, the lengths L2, L4, L6, and L8 are measured along the surfaces of the anode 107, the fourth control electrode 106, the third control electrode 105, and the second control electrode 104, respectively.

Distances L1, L3, L5, L7 between adjoining electrodes are typically low in relation to the respective lengths L2, L4, L6, L8. This allows the shapes of the equipotential surfaces occurring at the optical axis X position to be nearly concentrically spherical. Electrons passing through the first control electrode 103 are focused on the axial point O with essentially no aberration.

By including four control electrodes 103–106 in the electron gun of this embodiment, the electrodes form spherical equipotential surfaces in the vicinity of the optical axis in areas where the electrons have been sufficiently accelerated. In the area near the cathode 1 where the electrons have not been sufficiently accelerated, equipotential surfaces are provided that eliminate the space-charge effect. For this reason, electrons emitted from the cathode 1 are focused on the axial point O with essentially no aberration.

The electron gun of the second embodiment has the following advantages: Since the voltage of each electrode is supplied by a single power supply, the power supply itself can be made simpler. Also, as a result, any variation in the electric potential of each electrode is synchronized with the electric potentials of the other electrodes. This largely curtails variations in the potential difference between adjoining electrodes and reduces the number of variations in the equipotential surfaces. Also, the electrical resistors R1 through R4 are preferably not used in a vacuum. This allows the voltage ratio applied to each electrode to be changed easily when the resistance is changed.

In this embodiment, the shape of the electron-emission surface of the cathode 1 is preferably spherically concave. This is the ideal shape. However, the electron-emission surface could also be substantially planar, which would lower manufacturing costs.

Thus, this embodiment provides electron guns comprising a control electrode between the cathode and anode. This allows adjustment of the brightness and emittance by changing the voltage, shape and layout of the control electrode.

Whereas the invention has been described in connection with multiple preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. An electron gun for reducing projection-microlithography system, the electron gun comprising on an optical axis:

(a) a cathode comprising a planar or spherically concave electron-emission surface, the cathode being cylindrical relative to the optical axis;

(b) an anode spaced from said cathode along the optical axis;

(c) a Wehnelt electrode having a proximal portion proximal to the cathode and disposed around the cathode and having a distal portion between cathode and the anode and;

(d) a control electrode situated between the cathode and the anode, the anode being structured and arranged so as to be electrically grounded during operation of the electron gun, the Wehnelt electrode being structured and arranged so as to have an electric potential, during operation of the electron gun, which potential tends to push electrons, in an electron beam emitted from the cathode, toward the optical axis.

2. The electron gun of claim 1, wherein the control electrode comprises a spherical portion rotationally about the optical axis and having a curvature radius extending from a center point located on the optical axis.

3. The electron gun of claim 2, wherein the anode has a spherical portion symmetrical about the optical axis and having center of curvature extending from the center point.

4. The electron gun of claim 3, wherein the electron-emission surface is spherically concave with a curvature radius extending from the center point.

5. The electron gun of claim 4, wherein the anode and the control electrode have respective curvature radii, the curvature radius of the control electrode being midway between the curvature radius of the electron-emission surface and the curvature radius of the anode.

6. The electron gun of claim 1, wherein:

the electron-emission surface is planar, and the control electrode and the anode each have respective spherical portions symmetrical about the optical axis and having a single center point located on the optical axis.

7. The electron gun of claim 1, wherein an angle between the Wehnelt electrode and an edge of a beam envelope of an electron beam emitted from the cathode is 70–85°.

8. The electron gun of claim 7, wherein:

the electron-emission surface is spherically concave with a curvature radius extending from a center point on the optical axis; and the electron-emission surface of the cathode defines an edge that is radially symmetrical about the optical axis, the edge being at a half angle, between the optical axis and a line extending from the edge to the center point, of 5° or less.

9. The electron gun of claim 8, wherein:

the control electrode comprises a spherical portion symmetrical about the optical axis and having a center at the center point, the spherical portion of the control electrode defining a half angle $\phi_2$ relative to the center point and situated between the optical axis and a portion of the spherical portion located farthest from the optical axis;

the anode has a spherical portion symmetrical about the optical axis and having center of curvature at the center point, the spherical portion of the anode defining a half angle $\phi_1$ relative to the center point and situated between the optical axis and a portion of the spherical portion located farthest from the optical axis; and the larger of $\phi_1$ and $\phi_2$ being 80° or greater.

10. The electron gun of claim 1, wherein during operation the anode is electrically grounded, the Wehnelt electrode has an electric potential and the cathode has an electric potential that is the same as the electric potential of the Wehnelt electrode, wherein changing the electric potential of the control electrode controls a brightness of an electron beam produced by the electron gun.

11. The electron gun of claim 1, wherein:

the electron-emission surface is spherically concave with a curvature radius extending from a center point located on the optical axis;

the anode comprises a spherical portion symmetrical about the optical axis and having center of curvature at the center point; and a ratio of the curvature radius of the electron-emission surface and the curvature radius of the anode is at least 5.

12. The electron gun of claim 1, further comprising a housing adapted to have an electrically grounded potential during operation of the electron gun.

13. The electron gun of claim 12, wherein the electron beam emitted from the electron-emission surface propagates along a beam envelope, the electron gun further comprising an electrode that shields the beam envelope from the electrically grounded potential of the housing.

14. The electron gun of claim 1, wherein the control electrode is structured and arranged so as to be able to change the electric field at the electron emission surface of the cathode.

15. The electron gun of claim 1, wherein the control electrode is structured and arranged such that changing the potential of the control electrode during operation of the electron gun controls the brightness of an electron beam produced by the electron gun.

16. The electron gun of claim 1, wherein the control electrode and the anode each have a respective spherical portion symmetrical about the optical axis, each respective spherical portion having a curvature radius about a center point located on the optical axis.

17. The electron gun of claim 1, wherein said electrodes from equipotential surfaces for allowing, during operation of the electron gun, a large emittance along a beam envelope traversed by an electron beam during operation of the electron gun.

18. An electron gun, comprising on an optical axis:

(a) a cathode comprising a planar or spherically concave electron-emission surface;

(b) an anode spaced from said cathode along the optical axis;

(c) a Wehnelt electrode having a proximal portion proximal to the cathode and disposed around the cathode and having a distal portion between cathode and the anode; and (d) multiple control electrodes situated between the Wehnelt electrode and the anode, wherein, during operation of the electron gun, an electric field produced between the cathode and the anode is controlled by the control electrodes.

19. The electron gun of claim 18, wherein each of the control electrodes comprises a spherical portion symmetrical about the optical axis and situated adjacent the optical axis, each spherical portion defines an aperture concentric with the optical axis; and each spherical portion has a respective curvature radius extending from a single center point situated on the optical axis.

20. The electron gun of claim 19, wherein the anode comprises a spherical portion symmetrical about the optical axis and situated adjacent the optical axis, the spherical portion having a curvature radius extending from the center point.

21. The electron gun of claim 18, wherein the control electrodes are interconnected by electrical resistors so as to allow a single power supply to be used to apply electrical power to the control electrodes and the anode.

22. The electron gun of claim 20, wherein:

the spherical portions of adjacent control electrodes are separated from each other by a respective radial distance;

the anode and the adjacent control electrode are separated from each other by a respective radial distance; and each of the radial distances between the anode and the adjacent control electrode and between adjacent control electrodes being shorter than a length of an arc, concentric with said spherical surfaces, between the optical axis and a location on the respective anode and control electrodes where the respective spherical portion ends farthest away from the optical axis.

23. The electron gun of claim 20, wherein an equipotential surface is formed, during operation, in a region adjoining the cathode, the equipotential surface being shaped to cancel out a space-charge effect otherwise acting on an electron beam propagating from the electron-emission surface.

24. The electron gun of claim 14, wherein the control electrodes are structured and arranged such that changing the potential of the control electrodes, during operation of the electron gun, controls the brightness of an electron beam produced by the electron gun.

25. The electron gun of claim 14, wherein the control electrodes and the anode each comprise respective spherical portions symmetrical about the optical axis and situated adjacent the optical axis, the respective spherical portions each having a curvature radius about a center point on the optical axis.

* * * * *

UNITED STATES PATENT AND TRADEMARK OFFICE
CERTIFICATE OF CORRECTION

PATENT NO. : 6,051,917
DATED : April 18, 2000
INVENTOR(S) : Mamoru Nakasuji

It is certified that error appears in the above-identified patent and that said Letters Patent is hereby corrected as shown below:

Title page,
ABSTRACT,
Lines 12-13, between "KV," and "the brightness" insert -- then --, as shown in the Amendment dated 11/1/99.
Change "$A/cm^2.sr.$" to -- $A/cm^2 \cdot sr.$ -- as shown in the Application, ABSTRACT, Page 26, line 18.

Column 1,
Line 11, delete "such" as shown in the Amendment dated 11/1/99, Page 1, Column 10.

Column 2,
Line 4, change "portion symmetrical" to -- portion that is symmetrical -- as shown in the Amendment dated 11/1/99, Page 3, Line 11.
Lines 4-5, change "and having a center" to -- and that has a center -- as shown in the Amendment dated 11/1/99, Page 3, Line 11.
Lines 19-21, change "spherical portion rotationally about the optical axis and having a center of curvature" to -- spherical portion that is rotationally symmetrical about the optical axis and that has a center of curvature -- as shown in the Amendment dated 11/1/99, Page 3, Lines 29-30.
Line 23, change "5 mm." to -- 5. -- (i.e., delete "mm") as shown in the Amendment dated 11/1/99, Page 4, Line 1.
Line 43, change "portion symmetrical" to -- portion that is symmetrical -- as shown in the Amendment dated 11/1/99, Page 4, Line 22.
Line 51, change "spherical portion symmetrical" to -- spherical portion that is symmetrical -- as shown in the Amendment dated 11/1/99, Page 4, Line 31.

Column 3,
Line 10, change "drawings, are" to -- drawings are -- as shown in the Amendment dated 11/1/99, Page 5, Line 28.
Line 40, change "FIG. 7 is sectional" to -- FIG. 7 is a sectional -- (Application, Page 6, Line 26).

Column 4,
Line 5, change "$(A/cm^2.sr)$" to -- $A/cm^2 \cdot sr.$ -- as shown in the Application, page 7, Line 29.
Line 6, change "(μm.mrad)." to -- (μm·mrad), as shown in the Application, Page 7, Line 30.
Lines 18-19, change "the cathode 1 emitts" to -- the cathode 1 emits -- as shown in the Amendment dated 11/1/99, Page 8, Line 11.

CERTIFICATE OF CORRECTION

PATENT NO. : 6,051,917
DATED : April 18, 2000
INVENTOR(S) : Mamoru Nakasuji

It is certified that error appears in the above-identified patent and that said Letters Patent is hereby corrected as shown below:

Column 5,
Line 33, change ", e.g. electron" to -- , e.g., electron -- as shown in the Amendment dated 11/1/99, Page 11, Line 7.
Lines 43-44, change "resulting emittance when the control electrode voltage relative to each θ." to -- resulting emittance as a function of control electrode voltage for various angles θ. -- as shown in the Amendment dated 11/1/99, Page 11, Lines 18-19.
Line 45, change "(μm.mrad)." to -- (μm·mrad). -- as shown in the Application, Page 11, Line 20.
Line 46-47, change "μm.rad or less" to -- μm·mrad or less -- as shown in the Application, Page 11, Line 22.
Line 48, change "μm.mrad" to -- μm·mrad -- as shown in the Application, Page 11, Line 23.

Column 6,
Line 12, change "A/cm$^2$.sr." to -- A/cm$^2$·sr. -- as shown in the Application, page 12, Line 26.
Line 13, change "2x10$_4$ A/cm$^2$.sr." to -- 2x10$^4$ A/cm$^2$·sr. -- as shown in the Amendment dated 11/1/99, Page 12, Line 28.
Line 18, change "A/cm$^2$.sr." to -- A/cm$^2$·sr. -- as shown in the Application, page 13, Line 1.
Line 19, change "μm.mrad." to -- μm·mrad. -- as shown in the Application, Page 13, Line 2.
Line 22, change "and the hence the" to -- and hence the -- (Application, Page 13, Line 5).
Line 60, change "anode define" to -- anode defines -- as shown in the Amendment dated 11/1/99, Page 14, Line 15.

Column 7,
Line 2, change "of a concentric" to -- of a respective concentric -- as shown in the Amendment dated 11/1/99, Page 14, Line 24.
Line 7, change "electron discharge surface" to -- electron emission surface -- as shown in the Amendment dated 11/1/99, Page 14, Line 30.
Line 28, change "would be desirably" to -- desirably would be -- as shown in the Amendment dated 11/1/99, Page 15, Line 21.
Line 57-61, change "sufficiently small to produce, downstream of the first control electrode 103, concentric, spherical equipotential surfaces in the axial space through which the electron beam passes." to -- sufficiently small. -- as shown in the Amendment dated 11/1/99, Page 16, Lines 22-25.

UNITED STATES PATENT AND TRADEMARK OFFICE

CERTIFICATE OF CORRECTION

PATENT NO. : 6,051,917
DATED : April 18, 2000
INVENTOR(S) : Mamoru Nakasuji

It is certified that error appears in the above-identified patent and that said Letters Patent is hereby corrected as shown below:

Column 9,
Line 2, change "for reducing" to -- for a reducing -- as shown in the Amendment dated 6/2/99, Claim 1.
Line 13, change "and;" to -- ; and -- as shown in the Amendment dated 6/2/99, Claim 1.
Line 24, change "rotationally about" to -- rotationally symmetrical about -- as shown in the Amendment dated 11/1/99, Page 20, Line 15.
Line 39, change "planar, and" to -- planar; and -- as shown in the Amendment dated 11/1/99, Page 21, Line 5.
Line 66, change "having center" to -- having a center -- as shown in the Amendment dated 11/1/99, Page 22, Line 4.

Column 10,
Line 16, change "having center" to -- having a center -- as shown in the Amendment dated 11/1/99, Page 22, Line 6.
Line 44, change "from" to -- form -- as shown in the Amendment dated 6/2/99, Page 3.
Line 63, change "18, wherein" to -- 18, wherein: -- as shown in the Amendment dated 11/1/99, Page 23, Line 24.
Line 66, change "defines" to -- defining -- as shown in the Amendment dated 11/1/99, Page 23, Line 28.

Signed and Sealed this

Twenty-fifth Day of December, 2001

*Attest:*

JAMES E. ROGAN

*Attesting Officer*

*Director of the United States Patent and Trademark Office*